United States Patent
Terauchi et al.

(10) Patent No.: US 12,355,440 B2
(45) Date of Patent: Jul. 8, 2025

(54) SLEW RATE CONTROLLED OUTPUT BUFFER CIRCUIT AND SEMICONDUCTOR DEVICE

(71) Applicant: TAIWAN SEMICONDUCTOR MANUFACTURING COMPANY LTD., Hsinchu (TW)

(72) Inventors: Ryota Terauchi, Hsinchu (TW); Chia-Jung Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 77 days.

(21) Appl. No.: 18/346,264

(22) Filed: Jul. 2, 2023

(65) Prior Publication Data

US 2025/0007518 A1    Jan. 2, 2025

(51) Int. Cl.
*H03K 19/0185* (2006.01)
*H03K 19/003* (2006.01)

(52) U.S. Cl.
CPC .............. *H03K 19/018521* (2013.01); *H03K 19/00361* (2013.01); *H03K 19/00384* (2013.01)

(58) Field of Classification Search
CPC ..... H03K 19/018521; H03K 19/00361; H03K 19/00384
See application file for complete search history.

(56) References Cited

U.S. PATENT DOCUMENTS

2024/0195358 A1* 6/2024 Sasaki ................. H03B 5/04
2024/0201723 A1* 6/2024 Thakur ................ G05F 3/262

FOREIGN PATENT DOCUMENTS

KR    100836530 B1 * 10/2006

OTHER PUBLICATIONS

Soon-Kyun Shin; Wang Yu; Young-Hyun Jun; Jae-Whui Kim; Bai-Sun Kong; Chil-Gee Lee, "Slew-Rate-Controlled Output Driver Having Constant Transition Time Over Process, Voltage, Temperature, and Output Load Variations" (IEEE Transactions on Circuits and Systems—II: Express Briefs, vol. 54, No. 7, Jul. 2007).

* cited by examiner

*Primary Examiner* — Metasebia T Retebo
(74) *Attorney, Agent, or Firm* — WPAT LAW; Anthony King

(57) ABSTRACT

The present disclosure provides a semiconductor device, which includes a process monitor circuit, a controller, and an output buffer. The process monitor circuit is configured to measure process information of the semiconductor device. The controller is electrically connected to the process monitor circuit, and configured to generate a trimming code based on the measured process information. The output buffer is electrically connected to the controller, and configured to adjust a first bias current and a second bias current based on the trimming code.

20 Claims, 15 Drawing Sheets

SLEW RATE CONTROLLED OUTPUT BUFFER CIRCUIT AND SEMICONDUCTOR DEVICE

BACKGROUND

The present disclosure relates to digital circuits, and, in particular, to an output buffer circuit and a semiconductor device.

A digital buffer is an electronic circuit element used to isolate an input from an output. The buffer's output state mirrors the input state. Output buffers are widely used in various digital circuits, and it is desirable to support a wide range of output loads of the output buffers.

However, conventional output buffers have large variations of the rise time and fall time over process, voltage, temperature, and output load variations. In addition, it is difficult to fix the output load of the output buffers to control the variations of the rise time and fall time of the output buffers. Thus, there is demand for an output buffer circuit to solve the aforementioned problem.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1A:
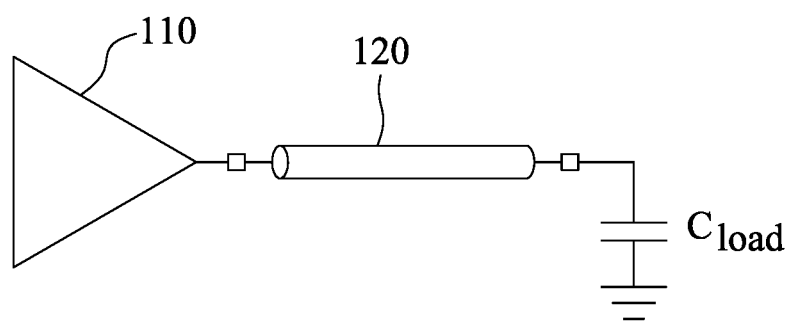
FIG. 1A is a diagram illustrating an output buffer and its load capacitance in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

Figure 1B:
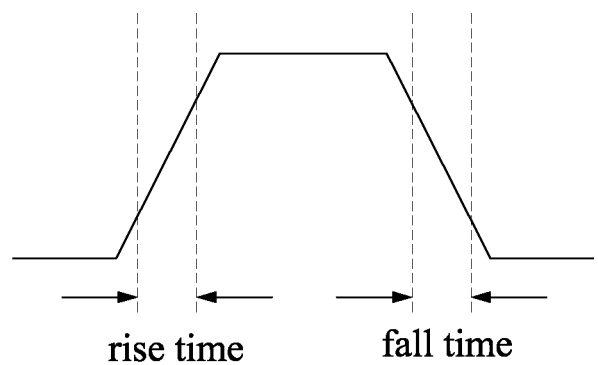
FIG. 1B is a waveform diagram illustrating the rise time and fall time of the output buffer in accordance with the embodiment of FIG. 1A.

FIG. 1A is a diagram illustrating an output buffer and its load capacitance in accordance with an embodiment of the present disclosure. FIG. 1B is a waveform diagram illustrating the rise time and fall time of the output buffer in accordance with the embodiment of FIG. 1A. Please refer to FIGS. 1A-1B.

As depicted in FIG. 1A, an output terminal of an output buffer 110 may be connected to a load capacitance $C_{load}$ through a transmission line 120. The load capacitance value is may depend on applications. Thus, the $C_{load}$ differences may affect the fall time and rise time of the output buffer 110.

The rise time and fall time of the output buffer can be referred to the waveform diagram in FIG. 1B. For example, the rise time may refer to the time required for a pulse or signal to increase from one specific value (e.g., 20%) of its amplitude to another (e.g., 80%). Similarly, the fall time may refer to the time required for a pulse or signal to decrease from one specific value (e.g., 80%) of its amplitude to another (e.g., 20%). It should be noted that the specific values defined for the rise time and fall time are examples, but the present disclosure is not limited thereto.

The rise time and fall time of the output buffer 110 may have large variations over process, voltage, temperature (PVT), and output loads. The rise time and fall time can be reduced using big size (e.g., larger width-length ratio) transistors for the output buffer 110, so is the variation of the rise time and fall time. However, low rise time and fall time may cause side effects such as crosstalk, ringing, reflection, ground, and power bounces, and they may also cause electromagnetic radiation (EMR) noise to other integrated circuits.

Figure 2A:
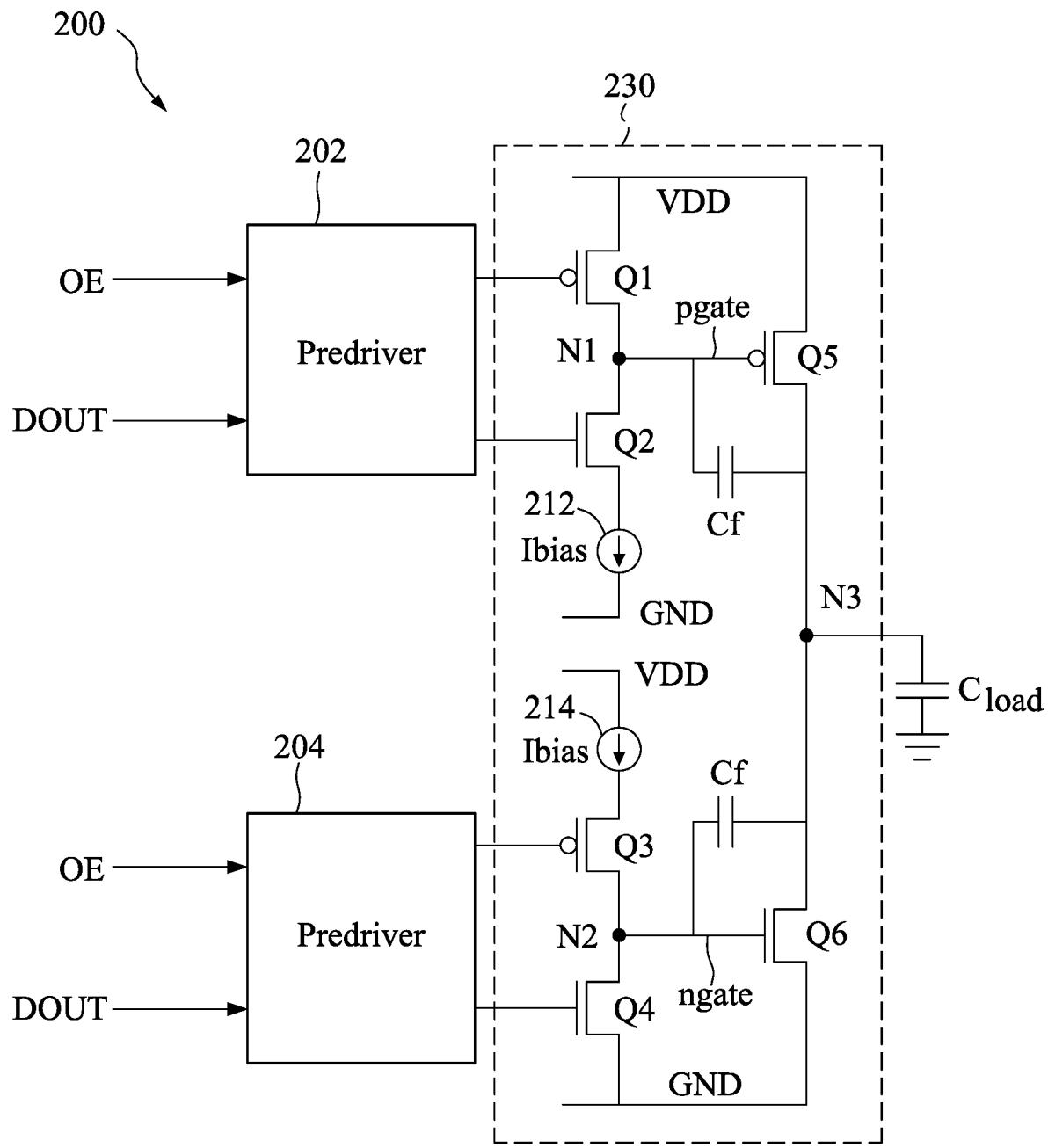
FIG. 2A is a schematic diagram of an output buffer circuit in accordance with an embodiment of the present disclosure.
Figure 2B:
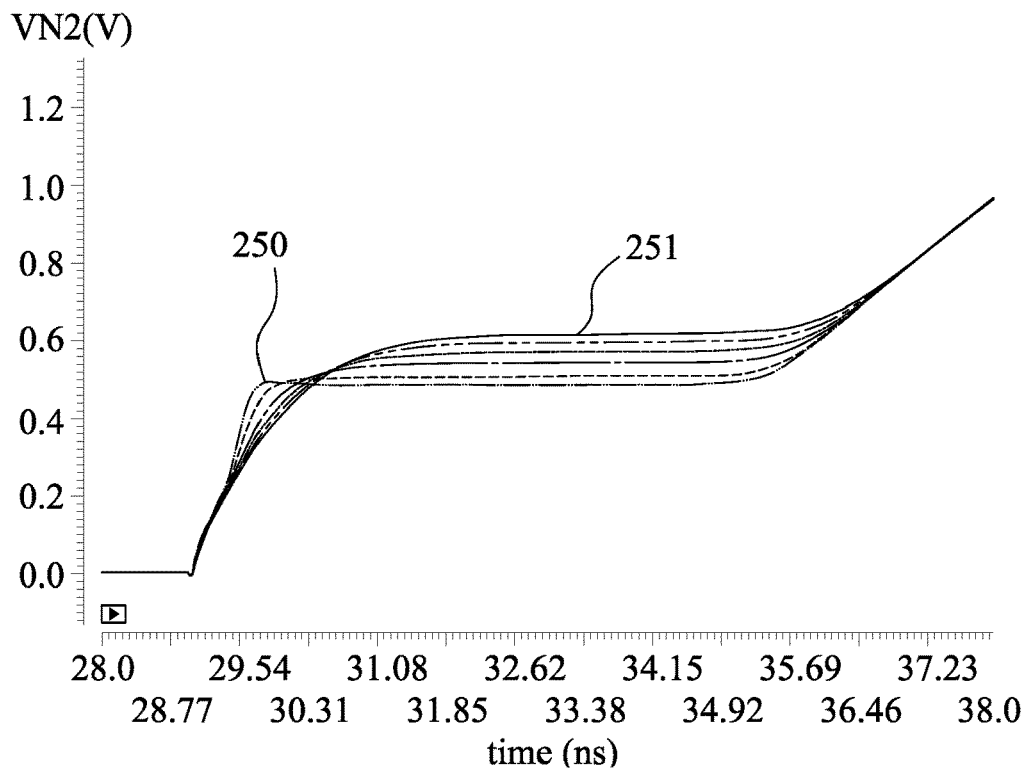
FIGS. 2B-2C are waveform diagrams of the gate voltage of the output buffer and the fall time of the output buffer with different output loads in accordance with the embodiment of the FIG. 2A.
Figure 2C:
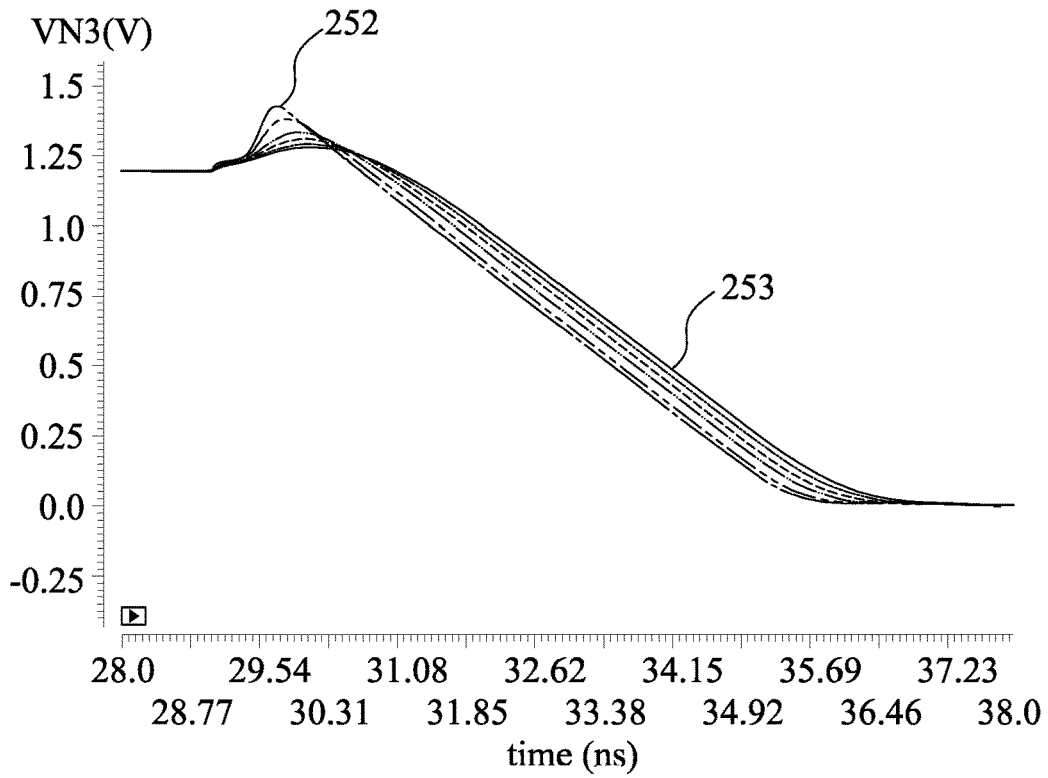

FIG. 2A is a schematic diagram of an output buffer circuit in accordance with an embodiment of the present disclosure. FIGS. 2B-2C are waveform diagrams of the gate voltage of the output buffer and the fall time of the output buffer with different output loads in accordance with the embodiment of the FIG. 2A. Please refer to FIGS. 2A-2C.

In an embodiment, an output buffer circuit 200 may include predrivers 202 and 204, and an output buffer 230, as shown in FIG. 2A. The predrivers 202 and 204 may receive a data signal DOUT and an output enable signal OE, and determine whether to output the data signal DOUT to the output buffer 230. For example, in response to the output enable signal OE being in a high logic state, the predrivers 202 and 204 may output the data signal DOUT to the transistors Q1 to Q4. In response to the output enable signal OE being in a low logic state, the predrivers 202 and 204 will not output the data signal DOUT to the transistors Q1 and Q4.

The output buffer 230 may include transistors Q1 to Q6, feedback capacitances Cf, and current sources 212 and 214. The transistors Q1, Q3, and Q5 may be P-type transistors, and the transistors Q2, Q4, and Q6 may be N-type transistors. In addition, the transistors Q1 to Q4 may be used as predriver transistors, and the transistor Q5 and Q6 may be output driver transistors. The transistor Q5 may be a PMOS output driver transistor, and the transistor Q6 may be an NMOS output driver transistor.

One feedback capacitance Cf is connected between the gate and drain of the transistor Q5, and the other feedback capacitance Cf is connected between the gate and drain of the transistor Q6. The feedback capacitances Cf can reduce the variations of the rise time and fall time of the output buffer circuit 200. The feedback capacitances Cf may control the voltage level of the gates of transistors Q5 and Q6 based on the load capacitance $C_{load}$.

The transistors Q1 to Q4 and the current sources 212 and 214 may form a current source structure. For example, the current source 212 and 214 may provide a bias current to charge the feedback capacitances Cf, and it can lower the variations of the rise time and fall time of the output buffer circuit 200 caused by the process, voltage, temperature, and output load capacitance variations.

The rise time Tr and fall time Tf of the output buffer circuit 200 can be expressed by formula (1) as follows:

$$Tr \cong Tf = \frac{k*Cf}{Ibias} \qquad (1)$$

where k is a proportional factor; Cf is the feedback capacitance; and Ibias denotes the bias current of the current sources 212 and 214. In addition, the fall time of the voltage VN3 at node N3 based on different load capacitances $C_{load}$ is illustrated in FIG. 2C, wherein the load capacitance $C_{load}$ may vary from 5 to 50 pF. For example, given that the load capacitance $C_{load}$ is 5 pF, the gate voltage pgate at node N2 may be illustrated as curves 250 and the fall time of voltage VN3 at node N3 may be illustrated as curves 252 shown in FIGS. 2B-2C. Given that the load capacitance $C_{load}$ is 50 pF, the gate voltage pgate at node N2 may be illustrated as curve 251 and the fall time of voltage VN3 at node N3 may be illustrated as curves 253 shown in FIGS. 2B-2C.

Figure 2D:
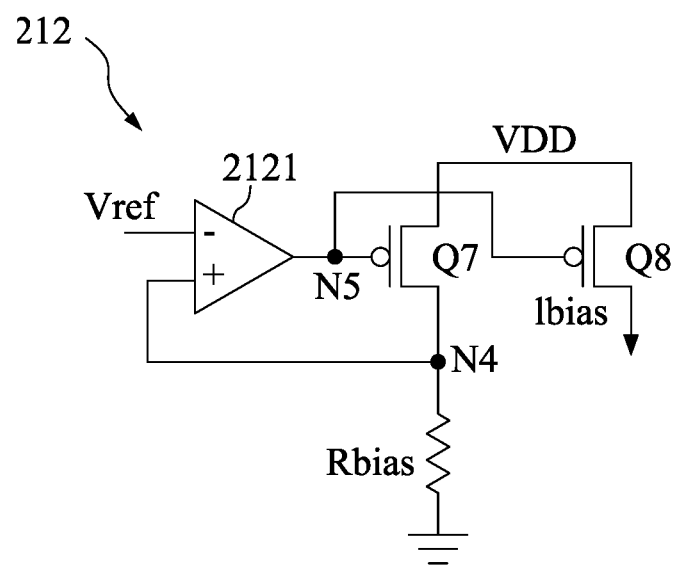
FIG. 2D is a schematic diagram of the current source in accordance with the embodiment of FIG. 2A.

FIG. 2D is a schematic diagram of the current source in accordance with the embodiment of FIG. 2A. Please refer to FIG. 2A and FIG. 2D.

In an embodiment, the current sources 212 and 214 may be regarded as a bias current generator, which includes an operational amplifier 2121, transistors Q7 and Q8, and a bias resistance Rbias, as shown in FIG. 2D. For example, the negative input terminal of the operational amplifier 2121 may receive a reference voltage Vref, and the positive input terminal of the operational amplifier 2121 may be connected to node N4. The output terminal (i.e., node N5) of the operational amplifier 2121 may be connected to the gates of transistors Q7 and Q8. The bias resistance Rbias is connected between node N4 and the ground. In some embodiments, the reference voltage Vref may be generated by a bandgap voltage reference circuit, but the present disclosure is not limited thereto.

The sources of transistors Q7 and Q8 are connected to the power supply voltage VDD. The drain of transistor Q7 is connected to node N4, and the drain of transistor Q8 may output the generated bias current Ibias.

Specifically, the reference voltage Vref may reach node N4, and the current generated by the bias current generator can be expressed by formula (2) as follows:

$$Ibias = \frac{Vref}{Rbias} \qquad (2)$$

Assuming that transistors Q7 and Q8 are substantially the same, since transistors Q7 and Q8 have the same voltage difference between the gate and the source, the bias current Ibias generated by transistor Q8 may be the same as that generated by transistor Q7. Based on formula (2), the rise time Tr and fall time Tf can be expressed by formula (3) as follows:

$$Tr \cong Tf = \frac{k*Cf}{Ibias} = \frac{k*Rbias*Cf}{Vref} \qquad (3)$$

Figure 3A:
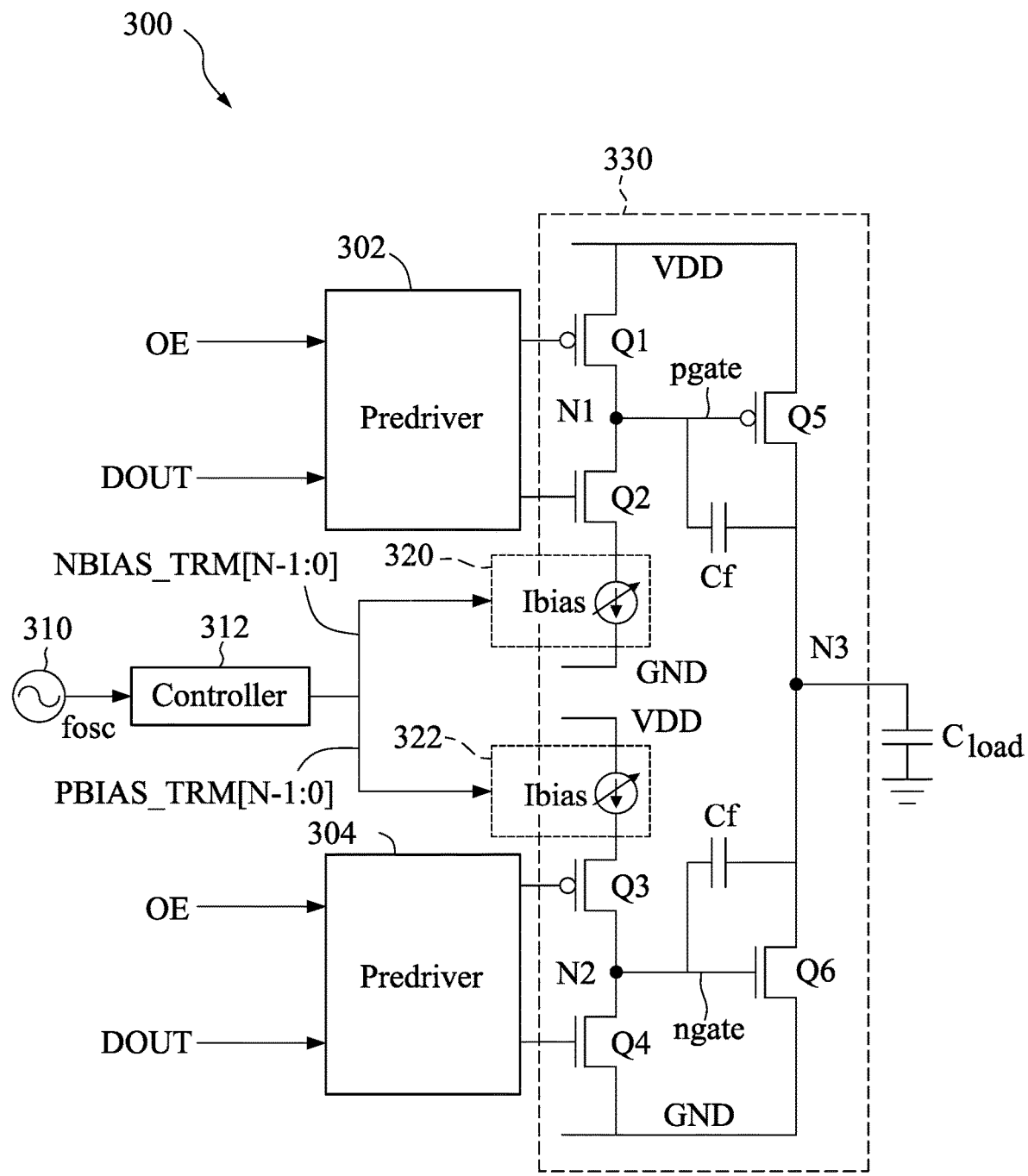
FIG. 3A is a schematic diagram of an output buffer circuit 300 in accordance with another embodiment of the present disclosure.
Figure 3B:
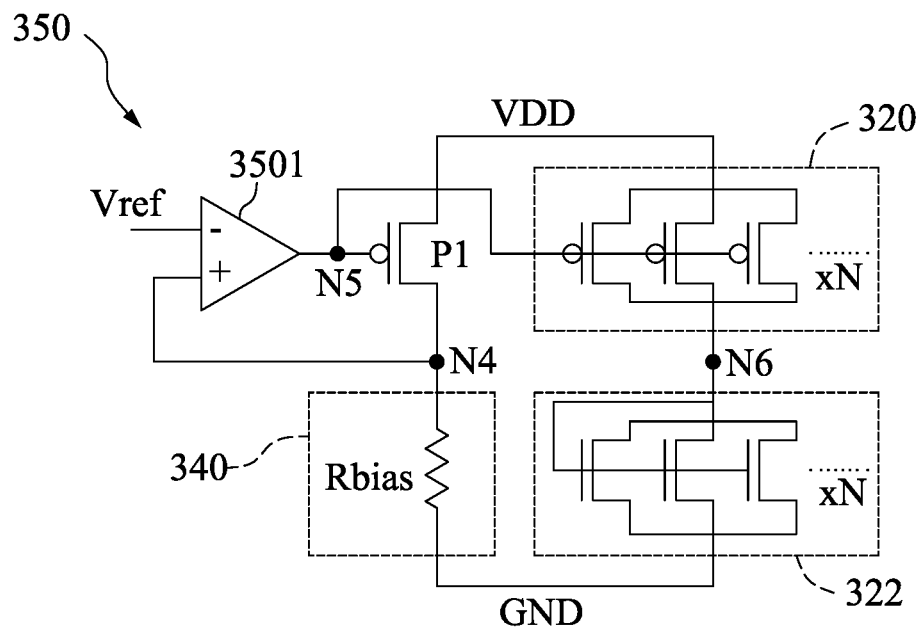
FIG. 3B is a schematic diagram of a current source in accordance with the embodiment of FIG. 3A.
Figure 3C:
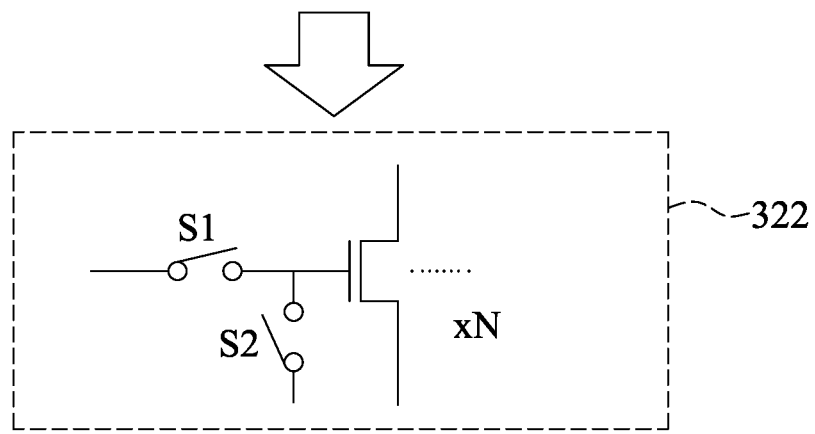
FIG. 3C is a schematic diagram illustrating control switches of the transistors in the current mirror in accordance with the embodiment of FIG. 3B.
Figure 3D:
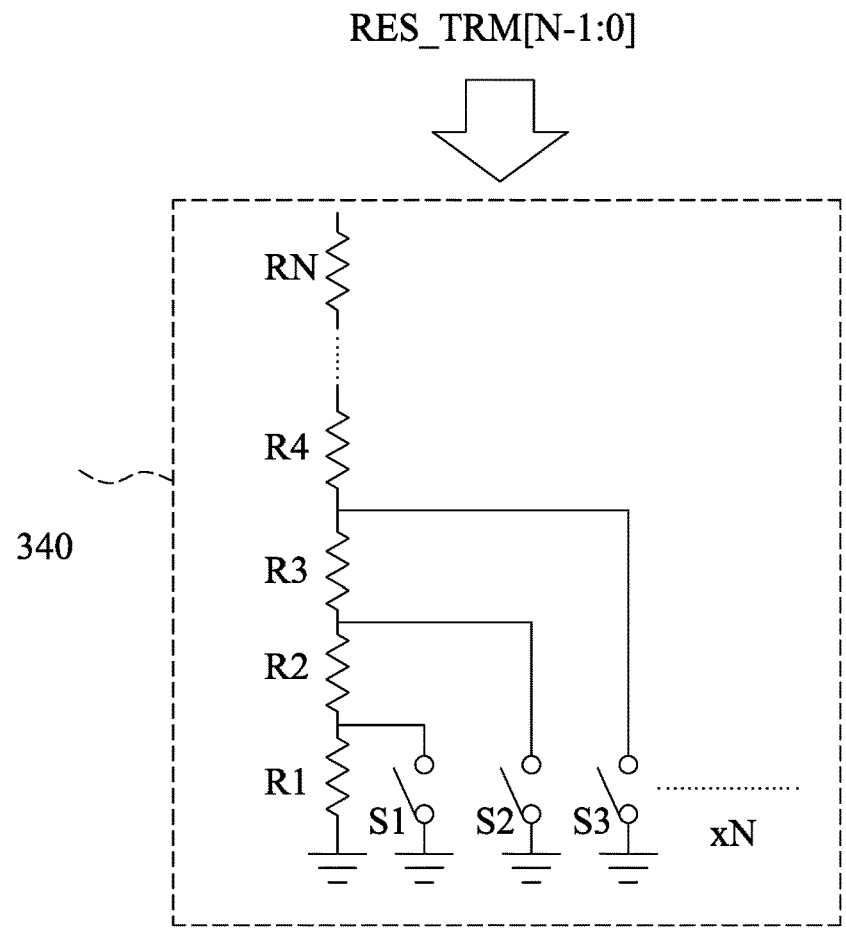
FIG. 3D is a schematic diagram illustrating the adjustable resistor circuit 340 in accordance with the embodiment of FIG. 3B.
Figure 3E:
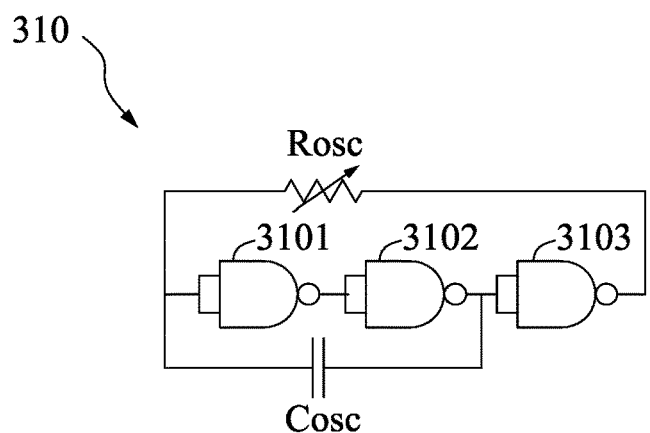
FIG. 3E is a schematic diagram of the oscillation circuit 310 in accordance with the embodiment of FIG. 3A.

FIG. 3A is a schematic diagram of an output buffer circuit 300 in accordance with another embodiment of the present disclosure. FIG. 3B is a schematic diagram of a current source in accordance with the embodiment of FIG. 3A. FIG. 3C is a schematic diagram illustrating control switches of the transistors in the current mirror in accordance with the embodiment of FIG. 3C. FIG. 3D is a schematic diagram illustrating the adjustable resistor circuit 340 in accordance with the embodiment of FIG. 3B. FIG. 3E is a schematic diagram of the oscillation circuit 310 in accordance with the embodiment of FIG. 3A. Please refer to FIGS. 3A-3E.

In another embodiment, an output buffer circuit 300 may include predrivers 302 and 304, an oscillation circuit 310, a controller 312, and an output buffer 330, as shown in FIG. 3A. The predrivers 302 and 304 may receive a data signal DOUT and an output enable signal OE, and determine whether to output the data signal DOUT to the output buffer 330. For example, in response to the output enable signal OE being in a high logic state, the predrivers 302 and 304 may output the data signal DOUT to the transistors Q1 to Q4. In response to the output enable signal OE being in a low logic state, the predrivers 302 and 304 will not output the data signal DOUT to the transistors Q1 and Q4.

The oscillation circuit 310 may be an RC oscillator which generates an oscillation frequency fosc based on a product of an oscillation resistance Rosc and an oscillation capacitance Cosc (i.e., Rosc*Cosc). For example, the oscillation circuit 310 may include NAND gates 3101~3103 connected in series, the oscillation resistance Rosc and the oscillation capacitance Cosc, as shown in FIG. 3E. Since two input terminals of each of the NAND gates 3101~3103 receive the same signal, the NAND gates 3101~3103 may act as inverters in this situation. Alternatively, the NAND gates 3101~3103 may be replaced by inverters connected in series, but the present disclosure is not limited thereto. In addition, the oscillation circuit 310 may be implemented using any other known RC-oscillation circuit in the art.

The output buffer 330 may include transistors Q1 to Q6, feedback capacitances Cf, and adjustable current sources 320 and 322. The transistors Q1, Q3, and Q5 may be P-type transistors, and the transistors Q2, Q4, and Q6 may be N-type transistors. In addition, the transistors Q1 to Q4 may be used as predriver transistors, and the transistor Q5 may be an output PMOS driver, and the transistor Q6 may be an output NMOS driver. Thus, the transistors Q5 and Q6 can be collectively regarded as output driver transistors.

One feedback capacitance Cf is connected between the gate and drain of the transistor Q5, and the other feedback capacitance Cf is connected between the gate and drain of the transistor Q6. The feedback capacitances Cf can reduce the variations of the rise time and fall time of the output buffer circuit 300. The feedback capacitances Cf may control the voltage level of the gates of transistors Q5 and Q6 based on the load capacitance $C_{load}$.

The transistors Q1 to Q4 and the adjustable current sources 320 and 322 may form a current source structure. For example, the adjustable current sources 320 and 322 may provide a bias current to charge the feedback capacitances Cf, and it can lower the variations of the rise time and fall time of the output buffer circuit 300 caused by the process, voltage, temperature, and output load capacitance variations. In some embodiments, the bias currents generated by the adjustable current sources 320 and 322 may be substantially the same.

In an embodiment, the bias currents of adjustable current sources 320 and 322 may be generated by the bias current generator 350 shown in FIG. 3B. For example, the bias current generator 350 may include an operational amplifier 3501, transistor P1, a bias resistance Rbias, adjustable current sources 320 and 322. For example, the negative input terminal of the operational amplifier 3501 may receive a reference voltage Vref, and the positive input terminal of the operational amplifier 3501 may be connected to node N4. The output terminal (i.e., node N5) of the operational amplifier 3501 may be connected to the gates of P-type transistors in the adjustable current source 320. The adjustable resistor circuit 340 is connected between node N4 and the ground. In some embodiments, the reference voltage Vref may be generated by a bandgap voltage reference circuit, but the present disclosure is not limited thereto.

The adjustable current source 320 may be a current mirror which includes a plurality of P-type transistors (i.e., N P-type transistors). The gates of the P-type transistors are connected to the output terminal (i.e., node N5) of the operational amplifier 3501, and the sources of the P-type transistors are connected to the power supply voltage VDD, and the drains of the P-type transistors are connected to node N6. Given that the P-type transistors in the adjustable current source 320 are turned on, the bias current Ibias generated by the adjustable current source 320 may be the total current of the currents generated by the P-type transistors. In some embodiments, the P-type transistors in the adjustable current source 320 may be of different sizes, so the current generated by each of the P-type transistors may be different. In some other embodiments, the P-type transistors in the adjustable current source 320 may be of the same size, so the current generated by each of the P-type transistors may be the same.

In addition, the adjustable current source 322 may be another current mirror which includes a plurality of N-type transistors (i.e., N N-type transistors). The gates and drains of the N-type transistors are connected to node N6, and the sources of the N-type transistors are connected to the ground GND. Given that the N-type transistors in the adjustable current source 322 are turned on, the bias current Ibias generated by the adjustable current source 322 may be the total current of the currents generated by the N-type transistors. In some embodiments, the N-type transistors in the adjustable current source 322 may be of different sizes, so the current generated by each of the N-type transistors may be different. In some other embodiments, the N-type transistors in the adjustable current source 322 may be of the same size, so the current generated by each of the N-type transistors may be the same.

In an embodiment, each of the N-type transistors in the adjustable current source 322 may be controlled by two switches S1 and S2 that are controlled by a respective trimming code, as shown in FIG. 3C. The controller 312 may generate a first trimming code NBIAS_TRM[N−1:0] (i.e., N bits), and each bit of the first trimming code NBIAS_TRM[N−1:0] may control the switches S1 and S2 of a respective N-type transistor in the adjustable current source 322.

For example, the switches S1 and S2 corresponding to the left most N-type transistor in the adjustable current source 322 may be controlled by the most significant bit (MSB) of the first trimming code NBIAS_TRM[N−1:0] (i.e., NBIAS_TRM[N−1]). The switches S1 and S2 corresponding to the right most N-type transistor in the adjustable current source 322 may be controlled by the least significant bit (LSB) of the first trimming code NBIAS_TRM[N−1:0] (i.e., NBIAS_TRM[0]). The switches S1 and S2 corresponding to each of the N-type transistors between the left most N-type transistor and the right most N-type transistor can be controlled by a respective bit of the first trimming code NBIAS_TRM[N−1:0].

In response to the MSB of the first trimming code NBIAS_TRM[N−1:0] (i.e., NBIAS_TRM[N−1]) being in the high logic state, the switches S1 and S2 corresponding to the left most N-type transistor are closed, so the gate of the left most N-type transistor can be supplied with power.

Thus, the left most N-type transistor is turned on to generate a bias current. In response to the MSB of the first trimming code NBIAS_TRM[N−1:0] (i.e., NBIAS_TRM[N−1]) being in the low logic state, the switches S1 and S2 corresponding to the left most N-type transistor are opened, so the gate of the left most N-type transistor will not be supplied with a voltage. Thus, the left most N-type transistor is turned off, and no bias current is generated by the left most N-type transistor. The switches S1 and S2 corresponding to other N-type transistors can be operated in a similar manner.

Although not shown in the figures, each of the P-type transistors in the adjustable current source 320 may have corresponding switches S1 and S2 in a manner similar to FIG. 3C, and the switches S1 and S2 corresponding to each P-type transistor may be controlled by a respective bit in the second trimming code PBIAS_TRM[N−1:0]. In some embodiments, the first trimming code NBIAS_TRM[N−1:0] and the second trimming code PBIAS_TRM[N−1:0] may be the same, and they can collectively regarded as a trimming code. In some other embodiments, the first trimming code NBIAS_TRM[N−1:0] and the second trimming code PBIAS_TRM[N−1:0] may be different since the sizes of P-type transistors and N-type transistors in the adjustable current sources 320 and 322 may be different.

The adjustable resistor circuit 340 may be implemented by the circuit shown in FIG. 3D. For example, the adjustable resistor circuit 340 may include N resistors R1 to RN and N switches S1 to SN. The switches S1 to SN are controlled by respective bits of the resistance trimming code RES_TRM[N−1:0]. For example, the switch S1 is controlled by the least significant bit (LSB) of the resistance trimming code RES_TRM[N−1:0] (i.e., RES_TRM[0]), and the switch S2 is controlled by the second least significant bit of the resistance trimming code RES_TRM[N−1:0] (i.e., RES_TRM[1]), and so on. It should be noted that the resistance trimming code RES_TRM[N−1:0] may be expressed by one hot codes, that is, only one bit of the resistance trimming code RES_TRM[N−1:0] is 1, and the remaining bits are 0.

For example, given that the LSB of the resistance trimming code RES_TRM[N−1:0] is 1 (i.e., other bits are 0), the switch S1 is closed, so the current will flow from node N4 shown in FIG. 3B to the ground through the resistors RN to R2, and the bias resistance Rbias may be R2+R3+ . . . RN. Given that the third least significant bit (i.e., RES_TRM[2]) of the resistance trimming code RES_TRM[N−1:0] is 1 (i.e., other bits are 0), the switch S3 is closed, so the current will flow from node N4 to the ground through the resistors RN to R4, and the bias resistance Rbias may be R4+R5+ . . . RN. Therefore, the bias resistance Rbias can be adjusted by the resistance trimming code RES_TRM[N−1:0] generated by the controller 312. It should be noted that the larger the number N is, the wider or more precise current control is achieved.

Please refer to FIG. 3E. The oscillation frequency fosc of the oscillation circuit 310 may be determined by the oscillation resistance Rosc and the oscillation capacitance Cosc. For example, the oscillation frequency fosc can be expressed by formula (4) as follows:

$$fosc = \frac{1}{2.2 * Rosc * Cosc} \quad (4)$$

Specifically, the controller 312 may measure the oscillation frequency of the oscillation circuit 310, and output the trimming code of the bias current generated by the adjustable current sources 320 and 322 based on the oscillation frequency. For example, if the product of the oscillation resistance Rosc and the oscillation capacitance Cosc is relatively large, the oscillation frequency fosc of the oscillation circuit 310 will be relatively low. At this time, the controller 312 may choose a trimming code to generate a larger current by the adjustable current sources 320 and 322.

Moreover, the oscillation resistance Rosc may be implemented using a circuit similar to the adjustable resistor circuit 340 shown in FIG. 3D, and the oscillation resistance Rosc may be controlled by a plurality of registers of the controller 312. For example, the controller 312 may measure the oscillation frequency fosc output by the oscillation circuit 310, and control the oscillation resistance Rosc to match the target frequency based on the measure oscillation frequency. When the controller 312 detects that the oscillation frequency fosc is higher than the target frequency, the controller 312 may configure the values of the registers to increase the oscillation resistance Rosc of the oscillation circuit 310. When the controller 312 detects that the oscillation frequency fosc is lower than the target frequency, the controller 312 may configure the values of the registers to decrease the oscillation resistance Rosc of the oscillation circuit 310. After the controller 312 modifies the values of the registers therein to increase or decrease the oscillation resistance Rosc, the controller will measure the oscillation frequency fosc again to determine whether the current oscillation frequency output by the oscillation circuit 310 matches the target frequency.

Once the controller 312 has detected that the oscillation frequency output by the oscillation circuit 310 matches the target frequency, the controller 312 will output the trimming code to adjust the bias current generated by the adjustable current sources 320 and 322.

In some embodiments, the variations of the rise time and fall time Tr or Tf before trimming and after trimming are respectively shown in Table 1 and Table 2 as follows:

TABLE 1

| Rosc | Cosc | Rosc*Cosc | Fosc | Tr or Tf |
|------|------|-----------|------|----------|
| 115% | 120% | 138% (max) | 72% | 138% (max) |
| 100% | 120% | 120% | 83% | 120% |
| 115% | 100% | 115% | 87% | 115% |
| 85% | 120% | 102% | 98% | 102% |
| 100% | 100% | 100% | 100% | 100% |
| 85% | 100% | 85% | 118% | 85% |
| 100% | 80% | 80% | 125% | 80% |
| 85% | 80% | 68% (min) | 147% | 68% (min) |

TABLE 2

| Trimming code | Ibias | Tr or Tf | Remarks |
|---------------|-------|----------|---------|
| 7 | 130% | 92% | Rosc*Cosc max |
| 6 | 120% | 100% | |
| 5 | 110% | 91% | |
| 4 | 100% | 120% | After trimming max |
| 4 | 100% | 100% | |
| 3 | 90% | 89% | After trimming min |
| 3 | 90% | 111% | |
| 2 | 80% | 100% | |
| 1 | 70% | 114% | Rosc*Cosc min |

For purposes of description, it is assumed that the trimming code is a 3-bit signal, which can range from 0 (3'b000) to 7 (3'b111), and the W/L ratios of the P-type transistors and N-type transistors in the adjustable current sources 320 and 322 are designed to fit the bias current corresponding to each trimming code. Referring to Tables 1 and 2, the variations of the rise time Tr and fall time Tr may become narrower from 68~138% before trimming to 89~120% after trimming.

Figure 3F:
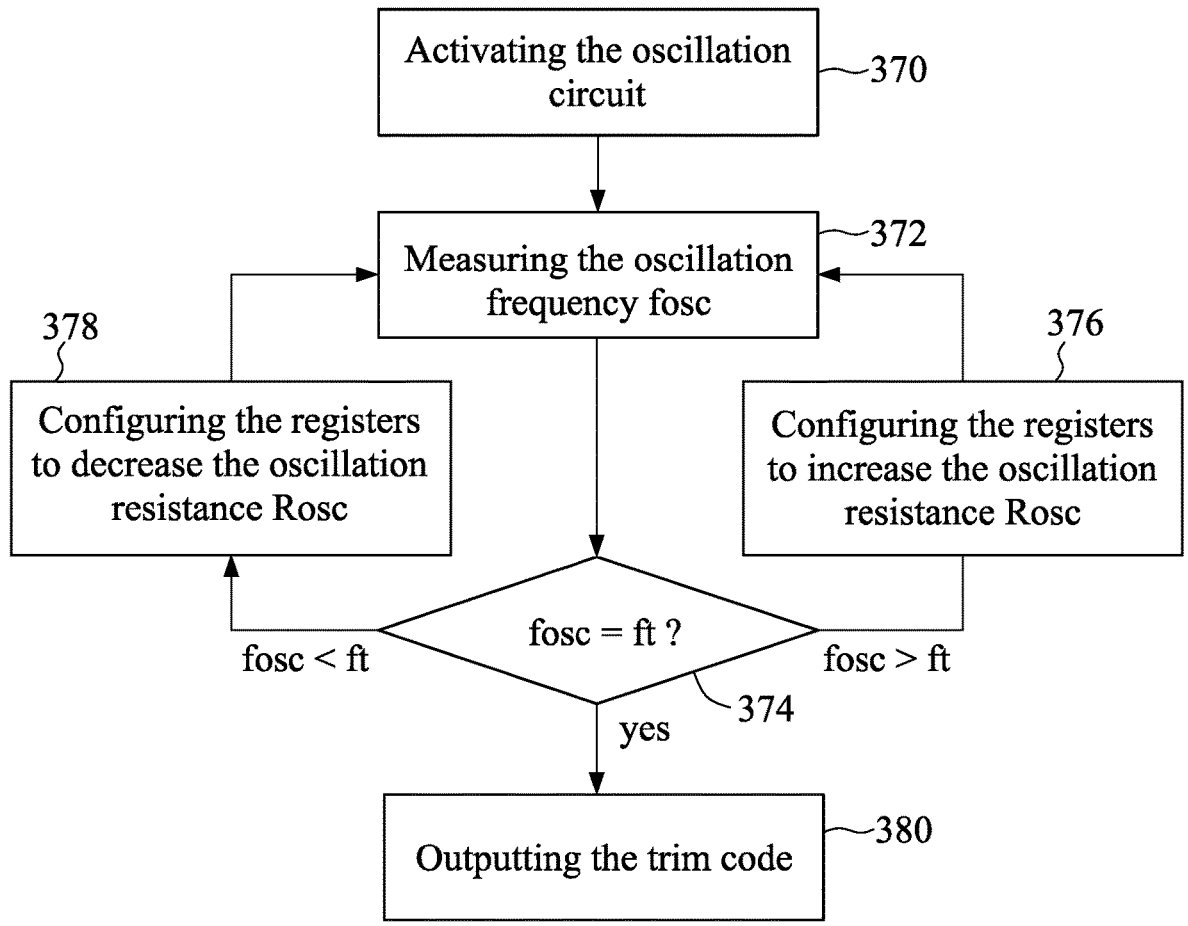
FIG. 3F is a flowchart of the controlling sequence for outputting the bias trimming code in accordance with the embodiment of FIG. 3E.

FIG. 3F is a flowchart of the controlling sequence for outputting the bias trimming code in accordance with the embodiment of FIG. 3E. Please refer to FIGS. 3A and 3E-3F.

In operation 370, the oscillation circuit 310 is activated.

In operation 372, the oscillation frequency fosc output by the oscillation circuit 310 is measured by the controller 312. For example, the oscillation frequency fosc of the oscillation circuit 310 may be determined by the oscillation resistance Rosc and the oscillation capacitance Cosc.

In operation 374, it is determined whether the oscillation frequency fosc equals to the target frequency ft. If the oscillation frequency fosc equals to the target frequency ft, operation 380 is performed. If the oscillation frequency fosc is higher than the target frequency ft, operation 376 is performed. If the oscillation frequency fosc is lower than the target frequency ft, operation 378 is performed.

In operation 376, the controller 312 configures the registers to increase the oscillation resistance Rosc. In operation 378, the controller 312 configures the registers to decrease the oscillation resistance Rosc. For example, the oscillation frequency fosc can be calculated by formula (4) as previously described, and it is inversely proportional to the oscillation resistance Rosc and the oscillation capacitance Cosc. Since the oscillation capacitance Cosc is fixed and the oscillation resistance Rosc is adjustable, the controller 312 can configure the registers associated with the oscillation resistance Rosc to adjust the overall oscillation resistance Rosc. If the oscillation frequency fosc is higher than the target frequency ft, the controller 312 may configure the registers to increase the oscillation resistance Rosc, thereby lowering the oscillation frequency fosc. If the oscillation frequency fosc is lower than the target frequency ft, the controller 312 may configure the registers to decrease the oscillation resistance Rosc, thereby raising the oscillation frequency fosc.

In operation 380, the controller 312 outputs the trimming code. For example, the trimming code may be NBIAS_TRM [N-1:0] for the N-type transistors in the adjustable current source 322 and PBIAS_TRM[N-1:0] for the P-type transistors in the adjustable current source 320. Thus, the bias current Ibias of the adjustable current sources 320 and 322 can be adjusted by the trimming code generated by the controller 312. It should be noted that the flowchart in FIG. 3F can be applied to the output buffer circuit 400 as well.

Figure 4A:
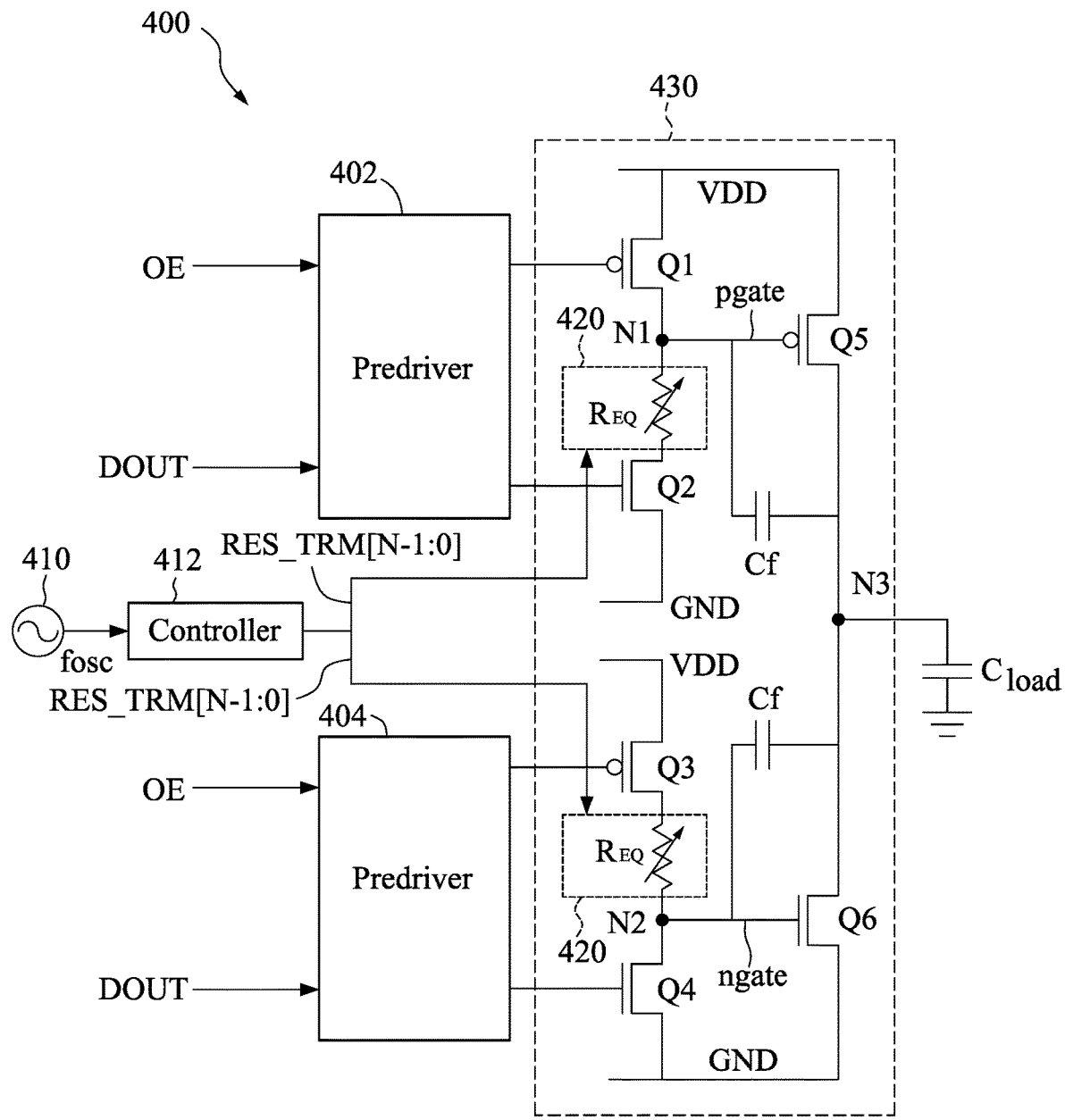
FIG. 4A is a schematic diagram of an output buffer circuit 400 in accordance with yet another embodiment of the present disclosure.
Figure 4B:
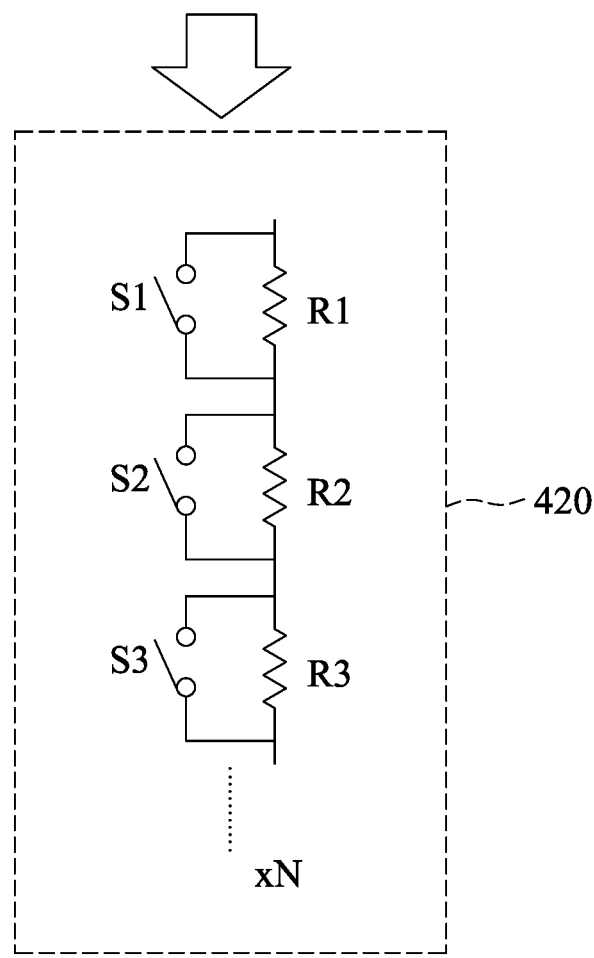
FIG. 4B is a schematic diagram of the adjustable resistor circuit 420 in accordance with the embodiment of FIG. 4A.

FIG. 4A is a schematic diagram of an output buffer circuit 400 in accordance with yet another embodiment of the present disclosure. FIG. 4B is a schematic diagram of the adjustable resistor circuit 410 in accordance with the embodiment of FIG. 4A. Please refer to FIG. 4A and FIG. 4B.

The output buffer circuit 400 shown in FIG. 4A may be similar to the output buffer circuit 300 shown in FIG. 3A, with the difference therebetween that the output buffer circuit 400 may include adjustable resistor circuits 420 to replace the adjustable current sources 320 and 322 in the output buffer circuit 300. In other words, the bias current flowing through the predriver transistors Q1 to Q4 may depend on the equivalent bias resistance $R_{EQ}$ of the adjustable resistor circuits 420.

The schematic diagram of the adjustable resistor circuit 420 is shown in FIG. 4B. The adjustable resistor circuit 420 may include a plurality of resistors R1 to RN and a plurality of switches S1 to SN. The resistors R1 to RN correspond to the switches S1 to SN. In addition, the switches S1 to SN are controlled by N registers of the controller 312. The values of the registers may represent a resistance trimming code RES_TRM[N-1:0]. For example, the switch S1 may be controlled by the least significant bit (LSB) of the resistance trimming code RES_TRM[N-1:0] (i.e., RES_TRM[0]), and the switch S2 may be controlled by the second least significant bit of the resistance trimming code RES_TRM[N-1:0] (i.e., RES_TRM[1]), and so on. In some embodiments, the switches S1 to SN may be implemented using CMOS (complementary metal oxide semiconductor) transmission gates, NMOS transistor switches, or PMOS transistor switches, but the present disclosure is not limited thereto.

When the LSB of the resistance trimming code RES_TRM[N-1:0] (i.e., RES_TRM[0]) is 1, the switch S1 is closed, so the current through the adjustable resistor circuit 420 will pass through the closed switch S1. When the LSB of the resistance trimming code RES_TRM[N-1:0] (i.e., RES_TRM[0]) is 0, the switch S1 is opened, so the current through the adjustable resistor circuit 420 will pass through the resistor R1. The other switches S2 to SN can be controlled in a similar manner. The equivalent bias resistance $R_{EQ}$ may be the sum of the resistors R1 to RN with their corresponding switches S1 to SN open. It should be noted that the larger the number N is, the wider or more precise resistance control.

Figure 5:
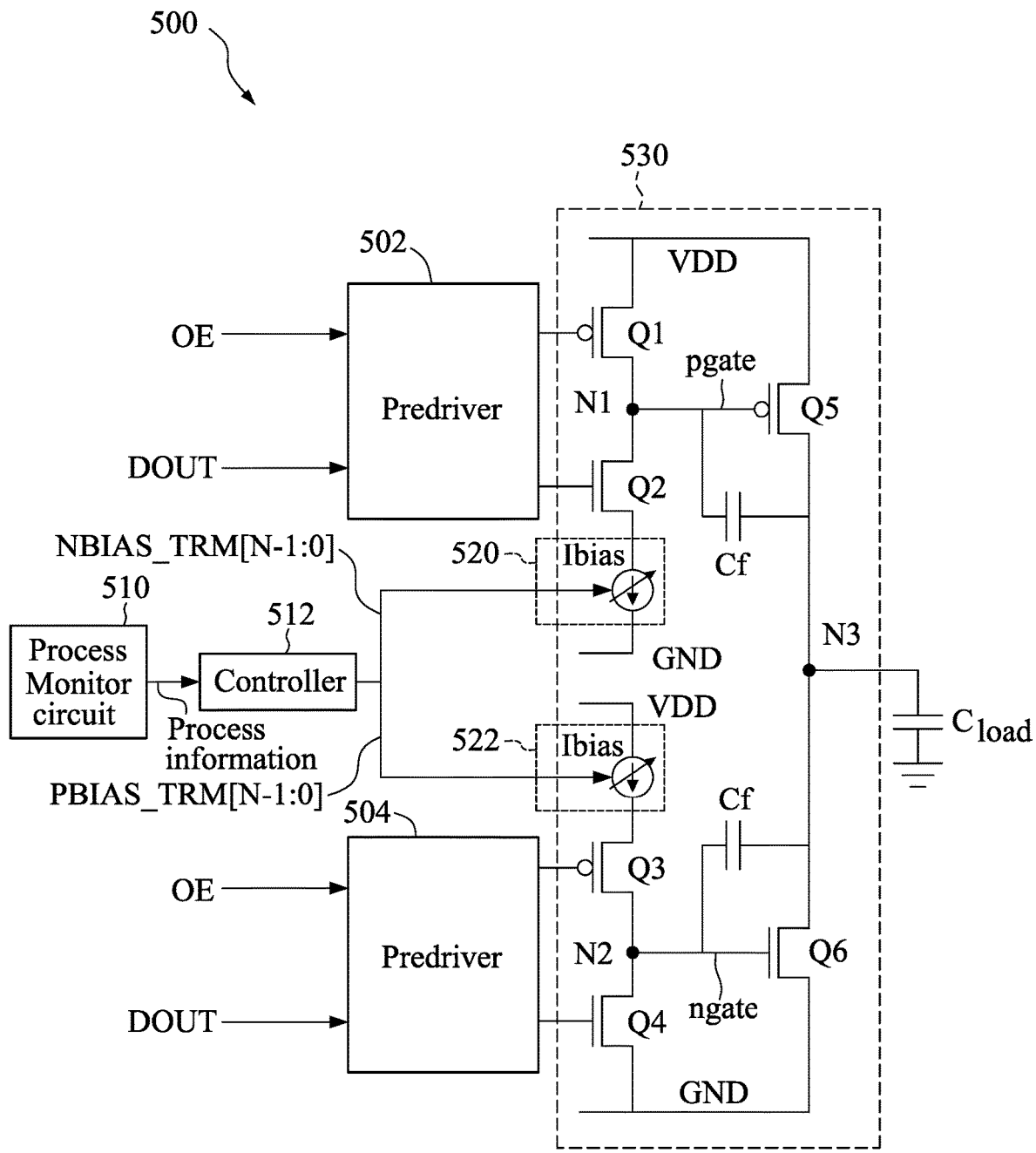
FIG. 5 is a schematic diagram of an output buffer circuit 500 in accordance with yet another embodiment of the present disclosure.

FIG. 5 is a schematic diagram of an output buffer circuit 500 in accordance with yet another embodiment of the present disclosure.

The output buffer circuit 500 shown in FIG. 5 may be similar to the output buffer circuit 300 shown in FIG. 3A, with the difference therebetween that a process monitor circuit 510 of the output buffer circuit 500 may replace the oscillation circuit 310 of the output buffer circuit 300. For example, the process monitor circuit 510 may keep monitoring the process information of the output buffer circuit 500, wherein the process information may include resistance value or capacitance value associated with the process used to fabricate the output buffer circuit 500. The controller 512 may control the current value of the adjustable current sources 520 and 522 based on the process information output from the process monitor circuit 510.

More specifically, after an integrated circuit including the output buffer circuit 500 is fabricated with a specific process or recipe, the process information (e.g., including resistance value or capacitance value associated with the process) of the output buffer circuit 500 is determined, and the process information can be measured by the process monitor circuit 510 before shipping the integrated circuit. Thus, the controller 512 may output the trimming code to the adjustable current sources 520 and 522 according to the process information measured by the process monitor circuit 510.

Figure 6A:
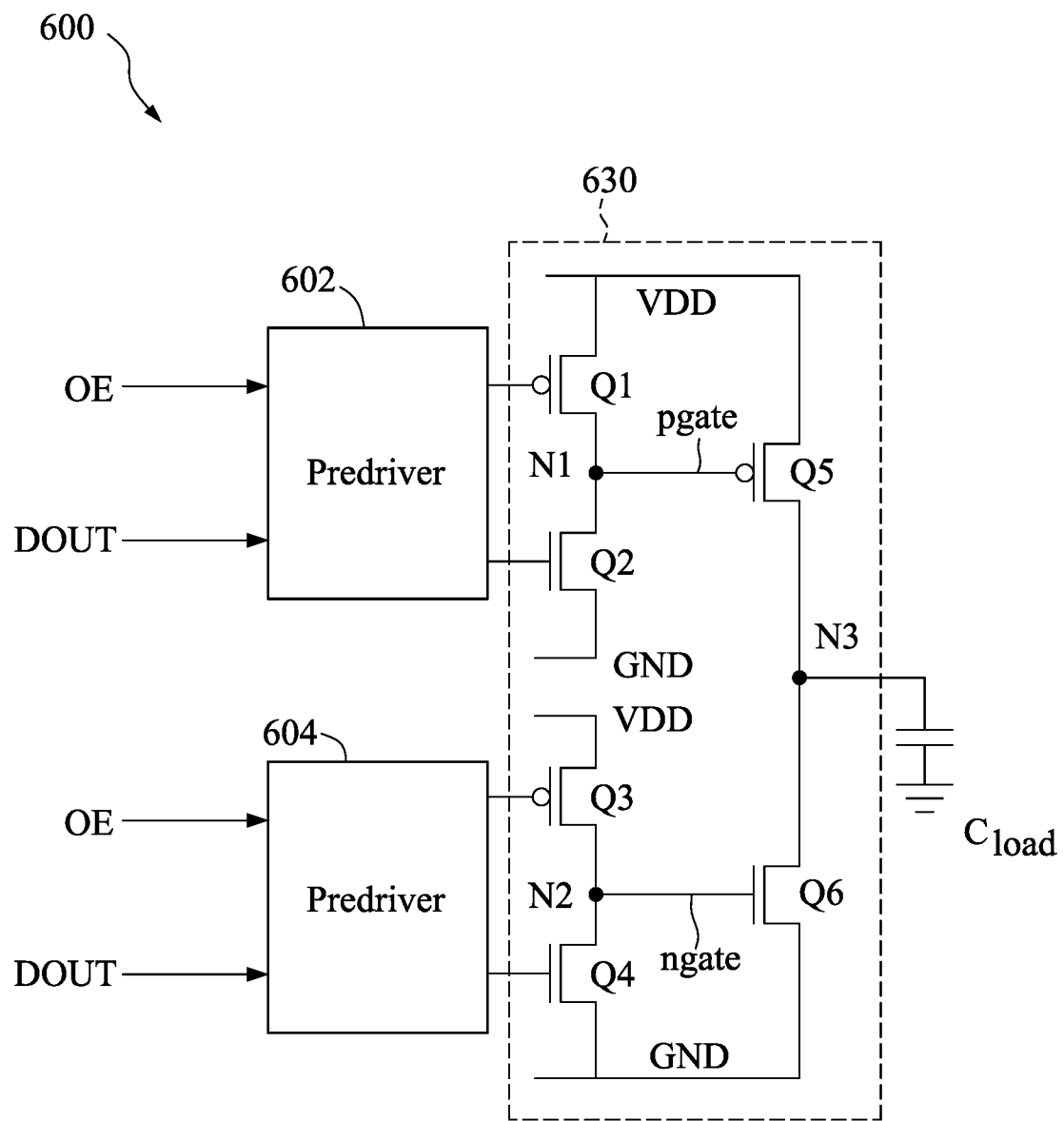
FIG. 6A is a schematic diagram of an output buffer circuit 600 in accordance with a first comparative embodiment of the present disclosure.
Figure 6B:
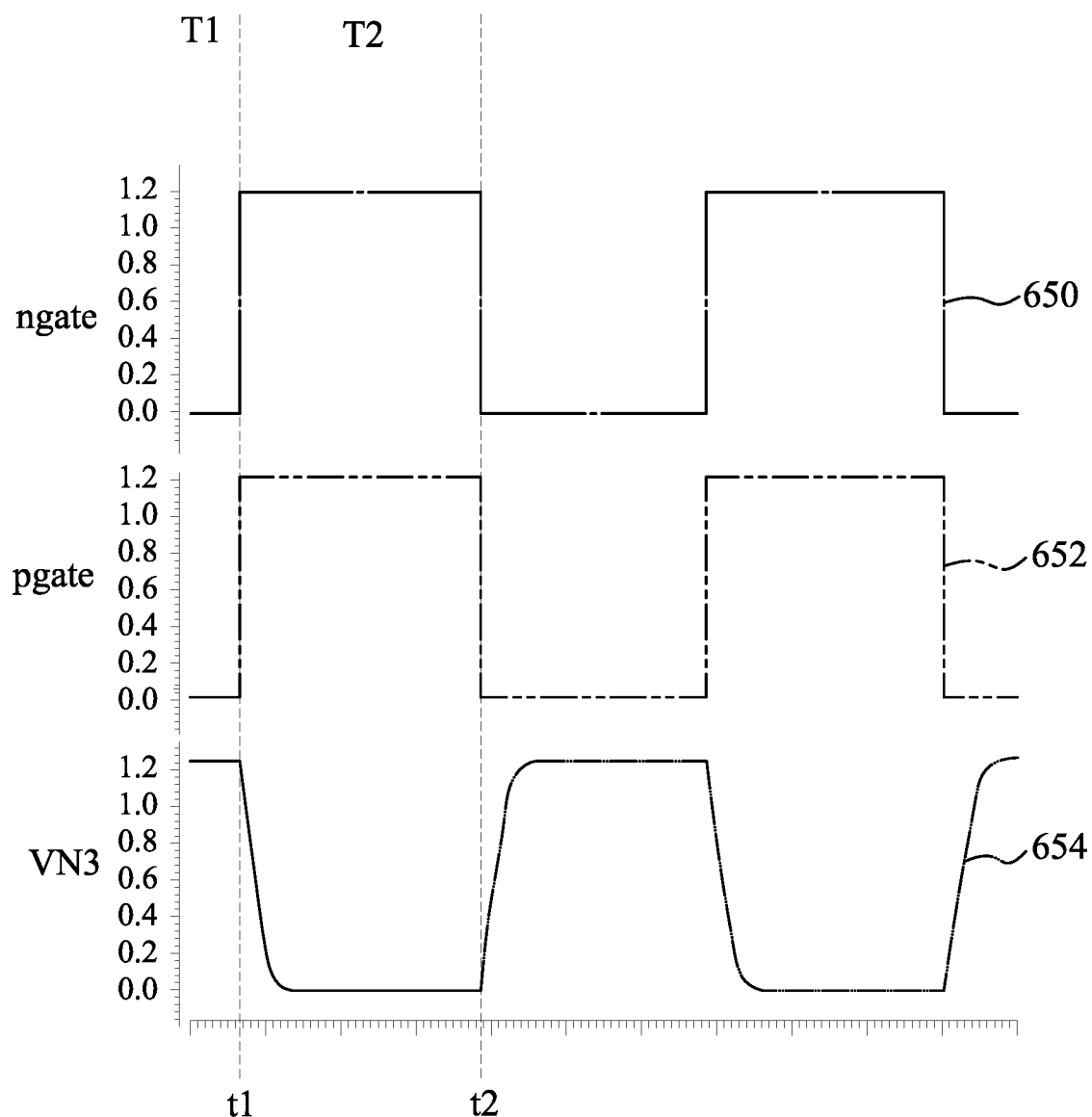
FIG. 6B is a waveform diagram of the voltages ngate, pgate, and VN3 in the output buffer circuit 600 in FIG. 6A.

FIG. 6A is a schematic diagram of an output buffer circuit 600 in accordance with a first comparative embodiment of the present disclosure. FIG. 6B is a waveform diagram of the voltages ngate, pgate, and VN3 in the output buffer circuit 600 in FIG. 6A. Please refer to FIGS. 6A-6B.

The output buffer circuit 600 shown in FIG. 6A may be similar to the output buffer circuit 200 shown in FIG. 2A, with the difference therebetween that the current sources 212 and 214 and feedback capacitors Cf are omitted in the output buffer circuit 600. In other words, the source of transistor Q2 is connected to the ground (GND), and the source of transistor Q3 is connected to the power supply voltage VDD.

Please refer to FIG. 6B. Curves 650, 652, and 654 denote the voltages ngate, pgate, and VN3, respectively. At time interval T1, the voltages at the gates of transistors Q1 and Q3 may be initially at the high logic state, and transistors Q1 and Q3 are turned off. In addition, the voltage VN3 at node N3 may be charged to the power supply voltage VDD through transistor Q5 since the voltage pgate is in the low logic state (i.e., the ground). At time t1, the voltages at the gates of transistors Q1 and Q3 may be switched to the low logic state. Thus, the transistors Q1 and Q3 are turned on, and the voltages ngate and pgate at nodes N2 and N1 are charged to the power supply voltage VDD. Meanwhile, since the voltage ngate at node N2 is charged to the power supply voltage VDD, transistor Q6 is turned on to discharge the load capacitance $C_{load}$ with a fully biased current $I_{ON}$ flowing through transistor Q6, and the voltage VN3 at node N3 will be discharged to the ground in a very short time.

At time t2, the voltages at the gates of transistors Q1 and Q3 may be switched to the high logic state. Thus, the transistors Q1 and Q3 are turned off, and the voltages ngate and pgate at nodes N2 and N1 are discharged to the ground (GND). Meanwhile, since the voltage pgate at node N1 is discharged to the ground GND, transistor Q5 is turned on to charge the load capacitance $C_{load}$ with the biased current $I_{ON}$ flowing through transistor Q5, and the voltage VN3 at node N3 will be charged to the power supply voltage VDD.

In this case, the rise time and fall time Tr or Tf may be expressed by formula (5) as follows:

$$Tr \text{ or } Tf \propto \frac{C_{load}}{I_{ON}}$$

The voltages ngate and pgate remain at the power supply voltage VDD at time interval T2. It should be noted that the bias current ION may be the same with different load capacitances (e.g., 5 pF~50 pF). However the rise time and fall time Tr and Tf is heavily affected by the load capacitance $C_{load}$.

Figure 7A:
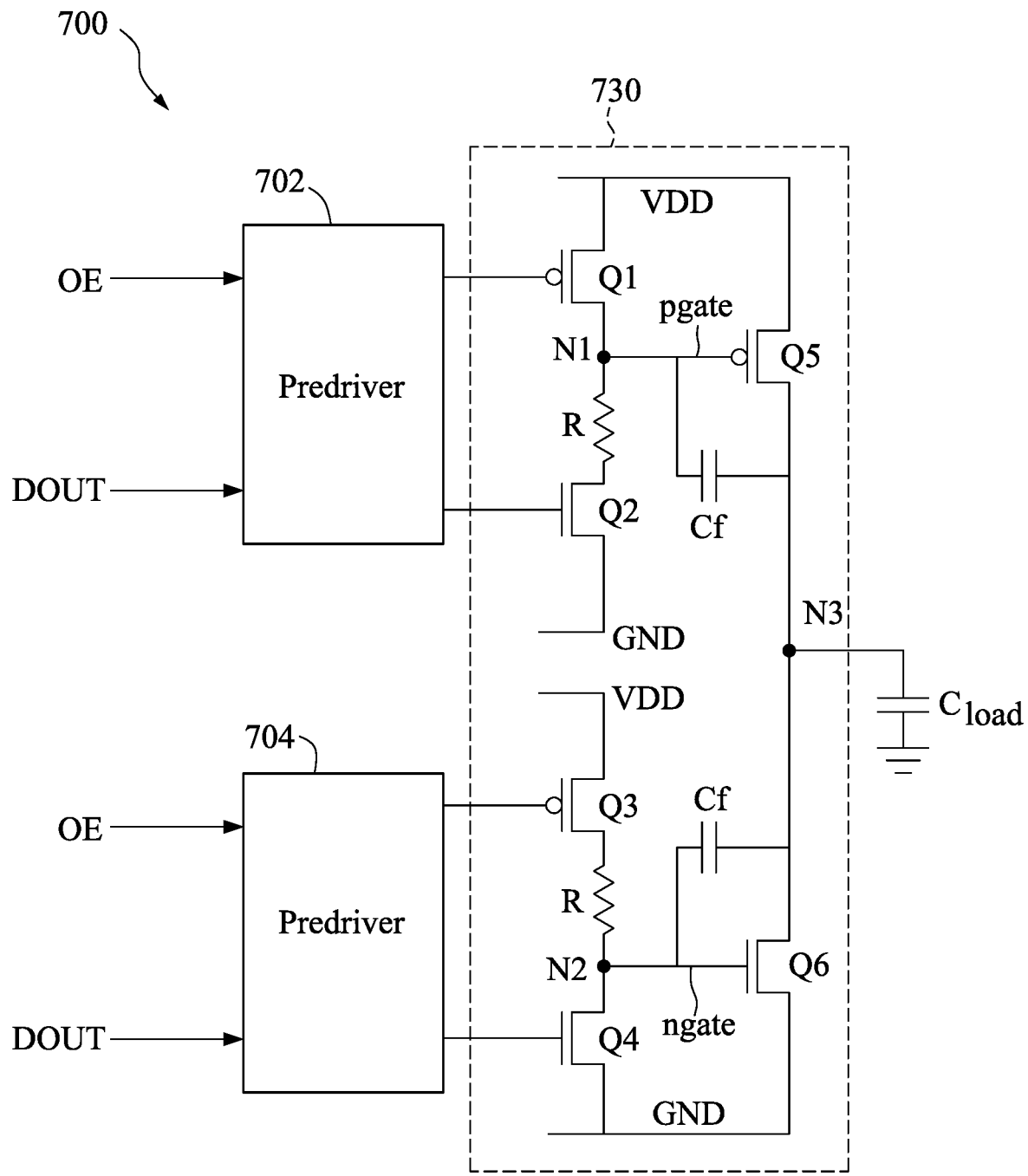
FIG. 7A is a schematic diagram of an output buffer circuit 600 in accordance with a second comparative embodiment of the present disclosure.
Figure 7B:
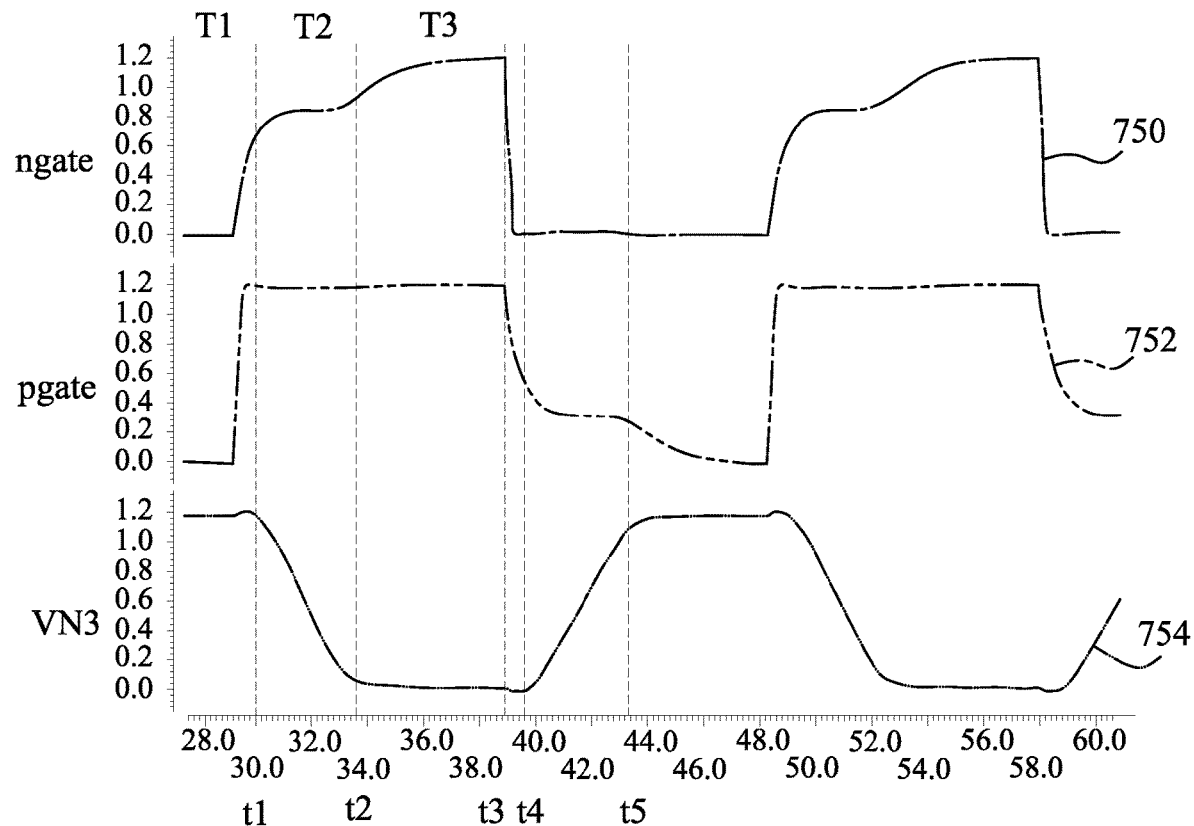
FIG. 7B is a waveform diagram of the voltages ngate, pgate, and VN3 in the output buffer circuit 600 in FIG. 7A.

FIG. 7A is a schematic diagram of an output buffer circuit 600 in accordance with a second comparative embodiment of the present disclosure. FIG. 7B is a waveform diagram of the voltages ngate, pgate, and VN3 in the output buffer circuit 600 in FIG. 7A. Please refer to FIGS. 7A-7B.

The output buffer circuit 700 shown in FIG. 7A may be similar to the output buffer circuit 200 shown in FIG. 2A, with the difference therebetween that the current sources 212 and 214 are omitted in the output buffer circuit 700, and a resistor R is disposed between node N1 and the drain of transistor Q2, and another resistor R is disposed between node N2 and the drain of transistor Q3.

Please refer to FIG. 7B. Curves 750, 752, and 754 denote the voltages ngate, pgate, and VN3, respectively. At time interval T1, the voltages at the gates of transistors Q1 and Q3 may be initially at the high logic state, and transistors Q1 and Q3 are turned off. In addition, the voltage VN3 at node N3 may be charged to the power supply voltage VDD through transistor Q5 since the voltage pgate is in the low logic state (i.e., the ground). At time t1, the voltages at the gates of transistors Q1 and Q3 may be switched to the low logic state. Thus, the transistors Q1 and Q3 are turned on, and the voltages ngate and pgate at nodes N2 and N1 will be gradually charged to the power supply voltage VDD. It should be noted that transistor Q6 is turned on when the voltage ngate is charged to the threshold voltage Vthn of transistor Q6 at time t1. At time t1, the turn-on current of transistor Q6 starts to discharge the load capacitance $C_{load}$. It should be noted that the charging speed of the feedback capacitor Cf and the discharging speed of the load capacitance $C_{load}$ are substantially the same. During time interval T3, after the load capacitance $C_{load}$ is fully discharged, the voltage ngate at node N2 is charged to the power supply voltage VDD at time t3. At time t3, the voltage pgate at node N1 and ngate at N2 will be discharged through the transistor Q2 and Q4.

At time t4, the voltage ngate at node N2 is discharged to a voltage below the threshold voltage Vthn, transistor Q6 is turned off. In addition, the voltage pgate at node N1 is discharged to a voltage level below VDD-Vthp. Thus, at time t4, the turn-on current of transistor Q5 starts to charge the load capacitance $C_{load}$. At time t5, the voltage VN3 at node N3 is charged to the power supply voltage VDD.

The rise time or fall time Tr or Tf of the output buffer circuit 700 can also be expressed by formula (5). Since the turn-on current ION of transistors Q5 and Q6 in the output buffer circuit 700 may vary due to different load capacitance $C_{load}$ (e.g., 5 pF~50 pF), the variation of the rise time or fall time Tr or Tf may be lower in comparison with the output buffer circuit 600 shown in FIG. 6A.

Referring back to FIGS. 2A-2D, variations of the bias resistance Rbias and feedback capacitance Cf may be large. For example, the variation of the feedback capacitance Cf may be between −20% and +20%, and the variation of the bias resistance Rbias may be between −15% and +15%. Therefore, it may cause large variations of the rise time Tr and fall time Tf, and the variation of the rise time and fall time Tr or Tf may be between −28% and +47%, which may be not appropriate for the design of the subsequent digital circuits.

In comparison with the embodiments of FIGS. 2A, 6A and 7A, the output buffer circuit 300 shown in FIG. 3 can support a wide range of output load capacitances $C_{load}$ and provide a narrower variation range of the rise time and fall time Tr or Tf, thereby facilitating the design of subsequent digital circuits and reduce the side effects such as crosstalk, ringing, reflection, ground and power bounces, and electromagnetic radiation noises.

In an embodiment, the present disclosure provides a semiconductor device, which includes a process monitor circuit, a controller, and an output buffer. The process monitor circuit is electrically connected to the controller, and to measure process information of the semiconductor device. The controller is electrically connected to the process monitor and configured to generate a trimming code based on the measured process information. The output buffer is electrically connected to the controller, and configured to adjust a first bias current and a second bias current based on the trimming code.

In another embodiment, the present disclosure provides an output buffer circuit, which includes an oscillation circuit, a controller, and an output buffer. The oscillation circuit is configured to generate an oscillation frequency. The controller is electrically connected to the oscillation circuit, and configured to generate a trimming code based on the oscillation frequency generated by the oscillation circuit. The output buffer is electrically connected to the controller, and configured to adjust a first bias current and a second bias current based on the trimming code.

In yet another embodiment, the present disclosure provides an output buffer circuit, which includes an oscillation circuit, a controller, and an output buffer. The oscillation circuit is configured to generate an oscillation frequency. The controller is electrically connected to the oscillation circuit, and configured to generate a trimming code based on the oscillation frequency generated by the oscillation circuit.

The output buffer is electrically connected to the controller, and configured to adjust a first bias resistance and a second bias resistance based on the trimming code.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. A semiconductor device, comprising:
    a process monitor circuit, configured to measure process information of the semiconductor device;
    a controller, electrically connected to the process monitor circuit, and configured to generate a trimming code based on the measured process information; and
    an output buffer, electrically connected to the controller, and configured to adjust a first bias current and a second bias current based on the trimming code,
    wherein the output buffer comprises: a first output driver transistor, a second output driver transistor, a first feedback capacitance, and a second feedback capacitance, wherein the first feedback capacitance is coupled between a gate and a first terminal of the first output driver transistor, and the second feedback capacitance is coupled between a gate and a first terminal of the second output driver transistor.

2. The semiconductor device of claim 1, wherein the measured process information comprises a resistance value or a capacitance associated with a process used to fabricate the semiconductor device.

3. The semiconductor device of claim 1, wherein a second terminal of the first output driver transistor is coupled to a power supply voltage, and a second terminal of the second output driver transistor is grounded, and the first terminal of the first output driver transistor is connected to the first terminal of the second output driver transistor and a load capacitance.

4. The semiconductor device of claim 3, wherein the output buffer further comprises:
    a first predriver transistor, having a gate coupled to a first predriver, a first terminal coupled to the power supply voltage, and a second terminal coupled to the gate of the first output driver transistor;
    a second predriver transistor, having a gate coupled to the first predriver, a first terminal coupled to the gate of the first output driver transistor, and a second terminal coupled to a first adjustable current source;
    a third predriver transistor, having a gate coupled to a second predriver, a first terminal coupled to a second adjustable current source, and a second terminal coupled to the gate of the second output driver transistor; and
    a fourth predriver transistor, having a gate coupled to the second predriver, a first terminal coupled to the gate of the second output driver transistor, and a second terminal being grounded.

5. The semiconductor device of claim 4, wherein the first bias current generated by the first adjustable current source and the second bias current generated by the second adjustable current source are controlled by the trimming code generated by the controller.

6. The semiconductor device of claim 1, wherein the first bias current and the second bias current are substantially the same.

7. An output buffer circuit, comprising:
    an oscillation circuit, configured to generate an oscillation frequency;
    a controller, electrically connected to the oscillation circuit, and configured to generate a trimming code based on the oscillation frequency generated by the oscillation circuit; and
    an output buffer, electrically connected to the controller, and configured to adjust a first bias current and a second bias current based on the trimming code,
    wherein the output buffer comprises: a first output driver transistor, a second output driver transistor, a first feedback capacitance, and a second feedback capacitance, wherein the first feedback capacitance is coupled between a gate and a first terminal of the first output driver transistor, and the second feedback capacitance is coupled between a gate and a first terminal of the second output driver transistor.

8. The output buffer circuit of claim 7, wherein the oscillation circuit is an RC oscillation circuit comprising a first NAND gate, a second NAND gate, and a third NAND gate, an oscillation resistance, and an oscillation capacitance,
    wherein the first NAND gate, the second NAND gate, and the third NAND gate are connected in series, and the oscillation resistance is coupled between input terminals of the first NAND gate and an output terminal of the third NAND gate, and the oscillation capacitance is coupled between the input terminals of the first NAND gate and an output terminal of the second NAND gate.

9. The output buffer circuit of claim 8, wherein a value of the oscillation resistance is controlled by a plurality of registers of the controller.

10. The output buffer circuit of claim 9, wherein the controller is further configured to determine whether the oscillation frequency equals to a target frequency,
    wherein in response to the oscillation frequency equals to the target frequency, the controller outputs the trimming code,
    wherein in response to the oscillation frequency being higher than the target frequency, the controller configures the registers to increase the oscillation resistance,
    wherein in response to the oscillation frequency being lower than the target frequency, the controller configures the registers to decrease the oscillation resistance.

11. The output buffer circuit of claim 7, wherein a second terminal of the first output driver transistor is coupled to a power supply voltage, and a second terminal of the second output driver transistor is grounded, and the first terminal of the first output driver transistor is connected to the first terminal of the second output driver transistor and a load capacitance.

12. The output buffer circuit of claim 11, wherein the output buffer further comprises:
- a first predriver transistor, having a gate coupled to a first predriver, a first terminal coupled to the power supply voltage, and a second terminal coupled to the gate of the first output driver transistor;
- a second predriver transistor, having a gate coupled to the first predriver, a first terminal coupled to the gate of the first output driver transistor, and a second terminal coupled to a first adjustable current source;
- a third predriver transistor, having a gate coupled to a second predriver, a first terminal coupled to a second adjustable current source, and a second terminal coupled to the gate of the second output driver transistor; and
- a fourth predriver transistor, having a gate coupled to the second predriver, a first terminal coupled to the gate of the second output driver transistor, and a second terminal being grounded.

13. The output buffer circuit of claim 12, further comprising: a bias current generator comprising:
- an operational amplifier, having a negative input terminal receiving a reference voltage, and a positive input terminal connected to a first node;
- a first P-type transistor, having a gate connected to an output terminal of the operational amplifier, a first terminal connected to the power supply voltage, and a second terminal connected to the first node;
- an adjustable resistor circuit, configured to output a bias resistance;
- the first adjustable current source, comprising a plurality of second P-type transistors, each with a gate, a first terminal, and a second terminal connected to the power supply voltage, a second node, and an output terminal of the operational amplifier, respectively; and
- the second adjustable current source, comprising a plurality of N-type transistors, each with a gate, a first terminal, and a second terminal connected to the second node, a ground, and the second node, respectively.

14. The output buffer circuit of claim 13, wherein each of the second P-type transistors corresponds to a first switch and a second switch that are controlled by a respective bit in the trimming code,
wherein each of the N-type transistors corresponds to a third switch and a fourth switch that are controlled by a respective bit in the trimming code.

15. An output buffer circuit, comprising:
- an oscillation circuit, configured to generate an oscillation frequency;
- a controller, electrically connected to the oscillation circuit, and configured to generate a trimming code based on the oscillation frequency generated by the oscillation circuit; and
- an output buffer, electrically connected to the controller, and configured to adjust a first bias resistance and a second bias resistance based on the trimming code, wherein the output buffer comprises a first adjustable resistor circuit configured to output the first bias resistance, and a second adjustable resistor circuit configured to output the second bias resistance.

16. The output buffer circuit of claim 15, wherein each of the first adjustable resistor circuit and the second adjustable resistor circuit comprises a plurality of resistors connected in series, and a plurality of switches corresponding to the resistors, wherein each of the switches is parallel to a respective resistor among the plurality of resistors, and is controlled by a respective bit of the trimming code.

17. The output buffer circuit of claim 16, further comprising: a first predriver transistor, a second predriver transistor, a third predriver transistor, and a fourth predriver transistor,
wherein the first adjustable resistor circuit is coupled between a drain of the first predriver transistor and a drain of the second predriver transistor, and the second adjustable resistor circuit is coupled between a drain of the third predriver transistor and a drain of the fourth predriver transistor.

18. The semiconductor device of claim 1, wherein the output buffer further comprises:
- a first predriver transistor, having a gate coupled to a first predriver, a first terminal coupled to the power supply voltage, and a second terminal coupled to the gate of the first output driver transistor;
- a second predriver transistor, having a gate coupled to the first predriver, a first terminal coupled to the gate of the first output driver transistor, and a second terminal coupled to a first adjustable current source;
- a third predriver transistor, having a gate coupled to a second predriver, a first terminal coupled to a second adjustable current source, and a second terminal coupled to the gate of the second output driver transistor; and
- a fourth predriver transistor, having a gate coupled to the second predriver, a first terminal coupled to the gate of the second output driver transistor, and a second terminal being grounded.

19. The output buffer circuit of claim 7, wherein the first bias current and the second bias current are substantially the same.

20. The output buffer circuit of claim 15, wherein the oscillation circuit is an RC oscillation circuit comprising a first NAND gate, a second NAND gate, and a third NAND gate, an oscillation resistance, and an oscillation capacitance,
wherein the first NAND gate, the second NAND gate, and the third NAND gate are connected in series, and the oscillation resistance is coupled between input terminals of the first NAND gate and an output terminal of the third NAND gate, and the oscillation capacitance is coupled between the input terminals of the first NAND gate and an output terminal of the second NAND gate.

* * * * *